United States Patent
Tanaka (10) Patent No.: US 10,452,340 B2
(45) Date of Patent: Oct. 22, 2019

(54) AUDIO DEVICE, AUDIO SYSTEM, AND VOLUME VALUE CONTROL METHOD

(71) Applicant: YAMAHA CORPORATION, Hamamatsu-shi (JP)

(72) Inventor: Ryo Tanaka, Concord, MA (US)

(73) Assignee: YAMAHA CORPORATION, Hamamatsu-Shi (JP)

( * ) Notice: Subject to any disclaimer, the term of this patent is extended or adjusted under 35 U.S.C. 154(b) by 0 days.

(21) Appl. No.: 15/304,166

(22) PCT Filed: Apr. 14, 2015

(86) PCT No.: PCT/JP2015/061519
§ 371 (c)(1),
(2) Date: Oct. 14, 2016

(87) PCT Pub. No.: WO2015/159900
PCT Pub. Date: Oct. 22, 2015

(65) Prior Publication Data
US 2017/0046122 A1 Feb. 16, 2017

(30) Foreign Application Priority Data

Apr. 14, 2014 (JP) .................................. 2014-083208
Nov. 6, 2014 (JP) .................................. 2014-225868

(51) Int. Cl.
G06F 3/16 (2006.01)
H03G 3/04 (2006.01)
H03G 7/00 (2006.01)

(52) U.S. Cl.
CPC .............. *G06F 3/165* (2013.01); *H03G 3/04* (2013.01); *H03G 7/002* (2013.01)

(58) Field of Classification Search
None
See application file for complete search history.

(56) References Cited

U.S. PATENT DOCUMENTS 7,278,101 B1 * 10/2007 Cassezza ............ G06F 3/04847
381/104
2011/0211712 A1 9/2011 Yamada et al.
(Continued)

FOREIGN PATENT DOCUMENTS

| JP | 2002125288 A | 4/2002 |
| JP | 2002221974 A | 8/2002 |
| JP | 2005115550 A | 4/2005 |

OTHER PUBLICATIONS

International Search Report issued in Intl. Appln. No. PCT/JP2015/061519, dated Jun. 30, 2015. English translation provided.
(Continued)

*Primary Examiner* — Curtis A Kuntz
*Assistant Examiner* — Kenny H Truong
(74) *Attorney, Agent, or Firm* — Rossi, Kimms & McDowell LLP (57) ABSTRACT

An audio device includes an amplifier having a volume control circuit, a communication circuit configured to communicate with a host apparatus, a processor, and a memory having stored thereon instructions executable by the processor to cause the audio device to perform: setting a volume value in the volume control circuit; receiving, from the host apparatus through the communication circuit, an instruction value indicating a volume value to be set in the volume control circuit; comparing the received instruction value with a set value that is a volume value set in the volume control circuit; and sending an instruction signal based on a comparison result to the host apparatus through the communication circuit.

21 Claims, 9 Drawing Sheets

(56) References Cited

U.S. PATENT DOCUMENTS

| | | | |
|---|---|---|---|
| 2012/0051560 A1 | 3/2012 | Sanders | |
| 2013/0073748 A1* | 3/2013 | Masuda | H04R 27/00 |
| | | | 710/15 |
| 2014/0037107 A1* | 2/2014 | Marino, Jr. | H03G 3/10 |
| | | | 381/107 |
| 2015/0078585 A1* | 3/2015 | Reilly | H03G 7/002 |
| | | | 381/107 |
| 2015/0195663 A1* | 7/2015 | Lin | H04R 1/1091 |
| | | | 381/58 |

OTHER PUBLICATIONS

Written Opinion issued in Intl. Appln. No. PCT/JP2015/061519, dated Jun. 30, 2015. English translation provided.
Office Action issued in Korean Patent Application No. 10-2016-7028638 dated Jun. 21, 2017. English translation provided.
Extended European Search Report issued in European Appln. No. 15779377.9 dated Nov. 16, 2017.
Office Action issued in Korean Appln. No. 10-2016-7028638 dated Dec. 28, 2017. English Translation provided.
Office Action issued in Chinese Appln. No. 201580019909.4 dated Aug. 22, 2018. English Translation Provided.

* cited by examiner

FIG.2

| STEP | VOLUME VALUE |
|---|---|
| 30 | -0.0 |
| 29 | -0.1 |
| 28 | -0.2 |
| 27 | -0.4 |
| ... | ... |
| 5 | -43.0 |
| 4 | -46.5 |
| 3 | -50.0 |
| 2 | -54.0 |
| 1 | -60.0 |
| 0 | — |

FIG.3

| STEP | VOLUME VALUE |
|---|---|
| 100 | -0.0 |
| 90 | -1.5 |
| 80 | -3.0 |
| 70 | -5.0 |
| 60 | -7.5 |
| 50 | -10.0 |
| 40 | -13.5 |
| 30 | -17.5 |
| 20 | -23.5 |
| 10 | -33.5 |
| 5 | -41.5 |
| 1 | -55.8 |
| 0 | — |

AUDIO DEVICE, AUDIO SYSTEM, AND VOLUME VALUE CONTROL METHOD

TECHNICAL FIELD

The present invention relates to an audio device to be connected to a host apparatus such as a personal computer by USB (universal Serial Bus) or the like, an audio system consisting of a host apparatus and an audio device, and, in particular, to control of a volume value of an audio device.

BACKGROUND ART

As for an audio device to be connected to a host apparatus such as a personal computer by USB, when the audio device is connected to the host, the audio device receives a volume value being held by the host and sets it in a volume control circuit. If the volume value that is received from the host and set in the volume control circuit is larger than a volume value that has been set therein so far, a loud sound may be output immediately after the connection to damage the device or adversely affect a human body. If the volume value received from the host is disregarded to solve this problem, equalization to the volume setting value of the host is not made.

PRIOR ART DOCUMENTS

Patent Documents

Patent document 1: JP-A-2002-221974

SUMMARY OF INVENTION

Technical Problem

For example, Patent document 1 discloses a system which changes a volume value automatically when a host (personal computer) and an audio device is connected to each other by USB. In this system, when the audio device is connected to the host apparatus, it is judged whether or not a volume value that is set in the system is equal to a maximum value. If the volume value is not equal to the maximum value, the volume value is changed to the maximum value, whereby normal sound volume control by an application is enabled. However, in this system, the volume value of the host (system) is changed by a host-side program, that is, the volume value is not changed by the audio device.

An object of the present invention is to maintain, in an audio device in which a volume value received from a host apparatus is to be set, a volume setting that has been employed before connection while equalization to a volume value of the host is made.

Means for Solving the Problems

An audio device according to the invention includes an amplifier having a volume control unit; a communication unit configured to communicate with a host apparatus; and a control unit configured to set a volume value in the volume control unit, wherein the control unit receives, from the host apparatus through the communication unit, an instruction value indicating a volume value to be set in the volume control unit, compares the received instruction value with a set value that is a volume value set in the volume control unit, and sends an instruction signal based on a comparison result to the host apparatus through the communication unit.

Advantages of the Invention

According to the invention, even if a volume value stored in the host is entirely different from a volume value that is currently set in the audio device, an event that a loud sound is emitted suddenly when the host and the audio device are connected to each other because a volume adjustment (volume equalization) is performed between them.

BRIEF DESCRIPTION OF DRAWINGS

FIGS. 5 (A) and 5(B) illustrate transitions of the instruction value that is sent from the host.

FIGS. 6 (A) and 6(B) are flowcharts illustrating how the control unit operates when a button is manipulated.

MODE FOR CARRYING OUT THE INVENTION

Figure 1:
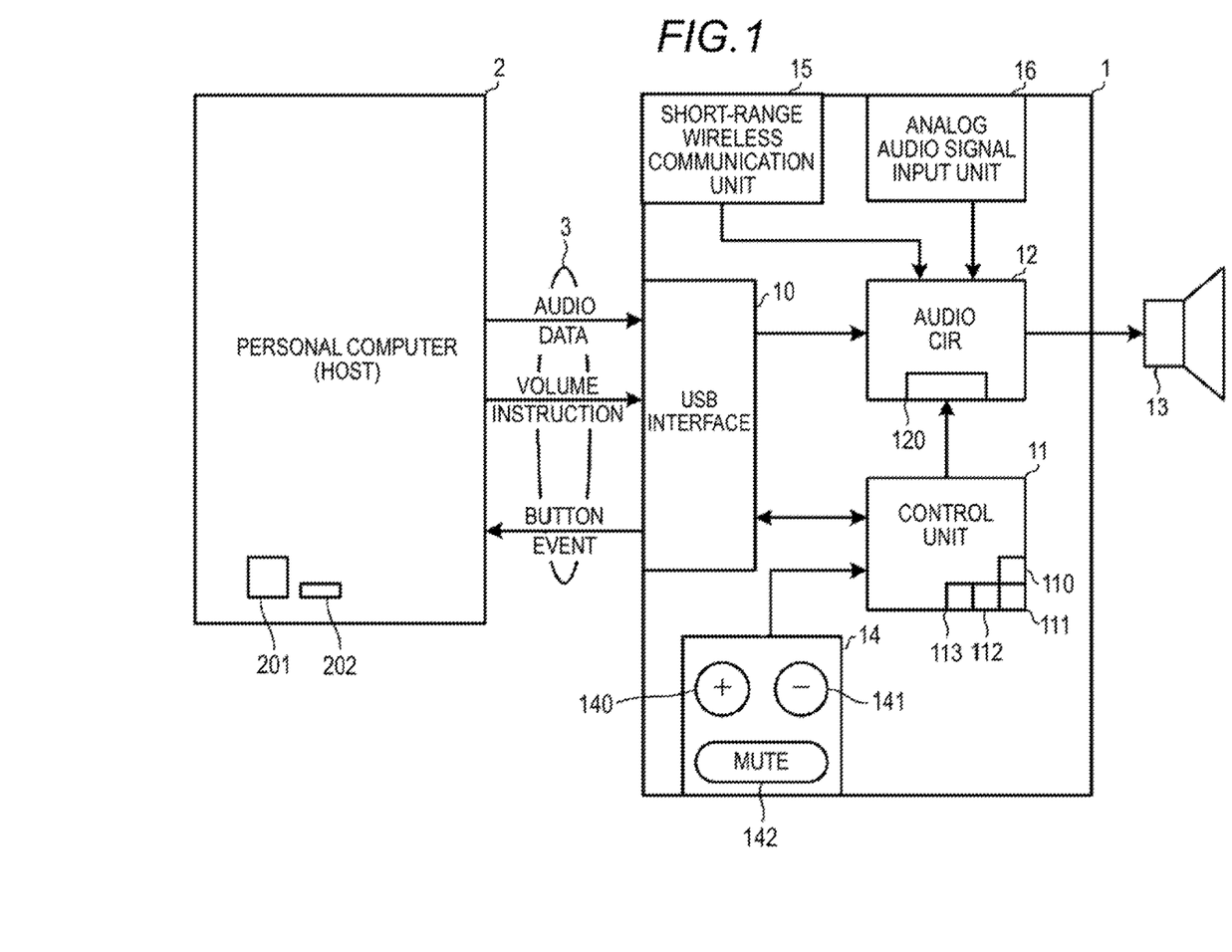
FIG. 1 is a block diagram of an audio device according to an embodiment of the present invention.

An audio device according to an embodiment of the present invention will be described with reference to the drawings. FIG. 1 is a block diagram of the audio device 1 according to the embodiment of the invention. The audio device 1, which is a device for emitting a sound of an externally input audio signal from a speaker 13, is equipped with a USB interface 10, a control unit 11, an audio circuit 12, the speaker 13, a manipulation unit 14, a short-range wireless communication unit 15, and an analog signal input unit 16.

A personal computer 2 as a host is connected to the USB interface 10. A device for outputting an audio signal such as a multi-function cell phone (smartphone) or a portable audio player is connected wirelessly to the short-range wireless communication unit 15. An apparatus for outputting, in the form of an analog signal, an audio signal of a video conference system or the like is connected to the analog signal input unit 16 by a cable. The audio circuit 12 amplifies an audio signal that is input through the USB interface 10, the short-range wireless communication unit 15, or the analog signal input unit 16, and outputs a resulting signal to the speaker 13. The speaker 13 emits a sound of the received audio signal.

The audio circuit 12 is equipped with a volume control circuit (volume controller) 120. The volume control circuit 120 is a circuit for controlling the sound volume of an input signal using a volume value (decibel value) that is set by the control unit 11. In the audio circuit 12, an audio signal whose sound volume has been controlled by the volume control circuit 120 is input to a power amplification circuit, where the audio signal is amplified to such a signal level as to be able to drive the speaker 13. The volume control circuit 120 may have any sound volume control range; in general, it suffices that the volume control circuit 120 be capable of control in a range from a maximum sound volume 0 dB to a minimum sound volume −60 dB.

The volume control circuit 120 is typically an electronic volume circuit which adjusts the level (voltage value) of an analog audio signal. Where the audio circuit 12 is configured as a digital signal processing system circuit, the volume control circuit 120 may be a function unit which adjusts sample values of a digital audio signal using a digital multiplier.

The control unit 11, which is a microcomputer or the like, controls the audio device 1. The control unit 11 sets a volume value (decibel value) for the volume control circuit 120 of the audio circuit 12. The control unit 11 determines a volume value to be set in the volume control circuit 120 on the basis of a manipulation signal received from the manipulation unit 14 or a volume instruction value received from the personal computer 2 through the USB interface 10.

The control unit 11 is equipped with a volume value table 110 for determination of a volume value to be set in the volume control circuit 120 and storage of volume values for that purpose, a volume value register 111, a step value register 112, and a mute flag 113. The volume value table 110 is a table for conversion from a volume step value into a volume value (decibel value).

The volume value table 110 and step values will be described below. The manipulation unit 14 is equipped with a "+" button 140, a "−" button 141, and a mute button 142 which can be manipulated by a user. The control unit 11 increases the volume value by one step when the "+" button 140 is pushed, and decreases the volume value by one step when the "−" button 141 is pushed. For example, the volume control circuit 120 is a circuit capable of adjusting the sound volume in units of 0.1 dB in a range of 0 dB to −60 dB. If a specification is such that the volume value is increased or decreased by 0.1 dB when the "+" button 140 or the "−" button 141 is manipulated once, a user needs to manipulate the "+" button 140 or the "−" button 141 many times to adjust the sound volume. In view of this, a measure is taken that the volume value is changed more than 0.1 dB when the "+" button 140 or the "−" button 141 is manipulated once (one-step manipulation), the range of 0 dB to −60 dB is divided into plural (about 30 to 100) steps, and proper volume values are correlated with the respective steps. The volume value table 110 is a table that is stored with a corresponding relationship between volume step values and volume values (decibel values).

Figure 2:
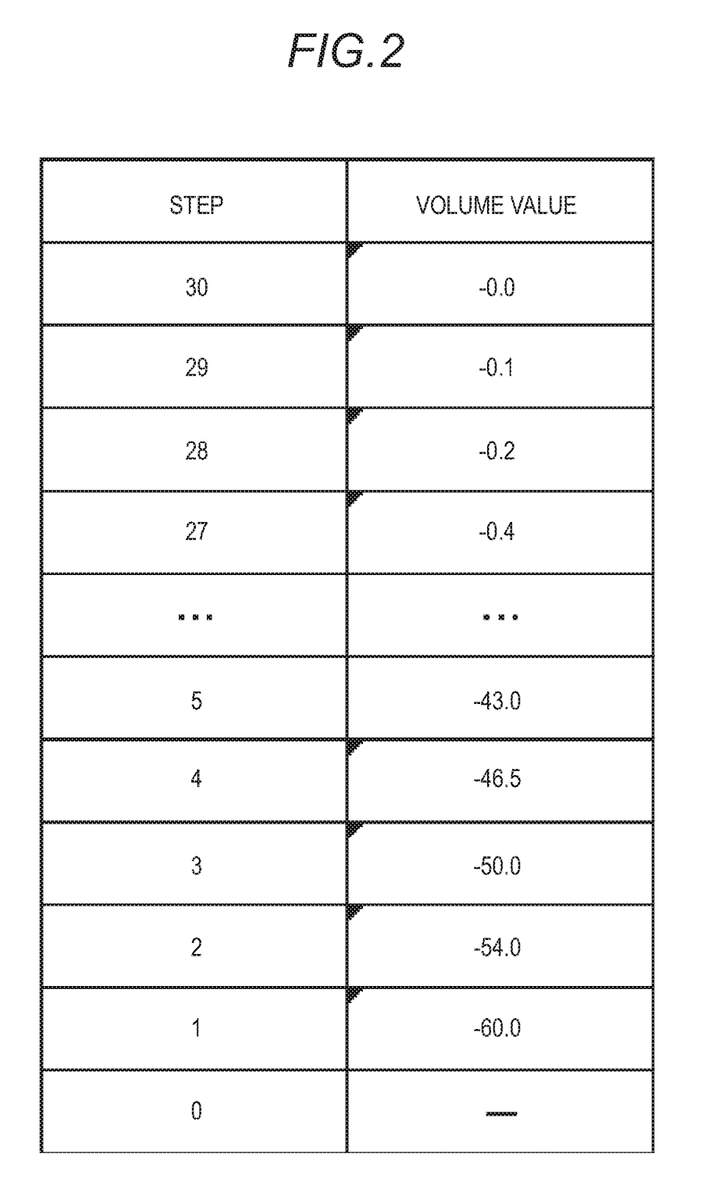
FIG. 2 shows an example volume value table of the audio device.

FIG. 2 shows an example volume value table 110. In this volume value table 110, a range from 0 dB to −60 dB are divided into 30 steps. In the volume value table 110, volume values are assigned to the respective step values in such a manner that the intervals between the step values are not uniform, that is, the interval (the difference between decibel values) increases as the sound volume decreases.

The volume value register 111 is a register for storing a volume value (decibel value) that is currently set in the volume control circuit 120, and the step value register 112 is a register for storing a step value that is selected currently. The mute flag 113 is a flag for storing information as to whether the audio circuit 12 is currently muted or not.

When the "+" button 140 is pushed, the control unit 11 increases the step value by "1," reads a volume value corresponding to a resulting step value from the volume value table 110, and sets the read-out volume value in the volume control circuit 120. When the "−" button 141 is pushed, the control unit 11 decreases the step value by "1," reads a volume value corresponding to a resulting step value from the volume value table 110, and sets the read-out volume value in the volume control circuit 120. Then the control unit 11 updates the step value register 112 and the volume value register 111 to the step value that has been increased or decreased by "1" and the volume value that has been read from the volume value table 110, respectively.

When the mute button 142 is pushed, the control unit 11 performs a toggle operation of muting or unmuting the audio circuit 12. Muting of the audio circuit 12 is processing of prohibiting sound emission by stopping an input or output irrespective of the volume value.

The audio device 1 is to be connected to the personal computer 2 by a USB cable 3. When the audio device 1 and the personal computer 2 are connected to each other by USB, the personal computer 2 behaves as a host and the audio device 1 behaves as a composite device of an audio device class and an HID (human interface device) class. That is, a descriptor indicating that the audio device 1 is a composite device of an audio device class and an HID class is written in the USB interface 10 of the audio device 1.

The personal computer 2 (host) is, for example, a computer that operates on the system program called Windows (registered trademark). A sound driver for controlling an audio class device and an HID device driver for controlling an HID class input device are installed in computers of this type as standard. Thus, as soon as a user connects the audio device 1 to the personal computer 2, the personal computer 2 recognizes the audio device 1 as an audio device and an input device without installation of drivers (plug and play).

Upon establishment of connection between the audio device 1 and the personal computer 2, the personal computer 2 deals with the audio device 1 as an externally connected (USB-connected) audio device and makes sound volume setting by sending, to the audio device 1, as an instruction value, a volume value (decibel value) that is set in a volume value register 202 by a volume control of its own system. In response, the audio device 1 makes equalization to a volume setting value of the personal computer 2 (host) by executing an equalization process (described later). At the same time, the audio device 1 maintains a volume value that has been employed before the establishment of the USB connection to the personal computer 2 to prevent sudden emission of a loud sound from the speaker 13. The details of the equalization process will be described later.

Subsequently, the personal computer 2 sends an audio signal reproduced by an application program or the like to the audio device 1 using an audio device driver. The application program for reproducing the audio signal is an audio reproduction program or an audio conference program, for example. The audio reproduction program is a program for reproducing an audio (musical) file stored in the personal computer 2. The audio conference program is a program for exchanging conference voices (audio signals) with other computers that are connected to the personal computer 2 by a network 4 (see FIG. 7).

The received audio signal is input to the audio circuit 12. The audio circuit 12 adjusts the sound volume of the audio signal using the volume value that is set currently, amplifies the thus-adjusted audio signal, and inputs the amplified audio signal to the speaker 13. The speaker 13 emits a sound of the received audio signal.

Upon the establishment of the connection between the audio device 1 and the personal computer 2, the "+" button 140, the "−" button 141, and the mute button 142 of the manipulation unit 14 function as HID device manipulators and manipulation information of each of these buttons is sent to the personal computer 2 (host) as an HID class report. Based on the manipulation information, the personal computer 2 sends a command for controlling the volume value to the audio device 1. This command is sent as an audio device class command.

Figure 3:
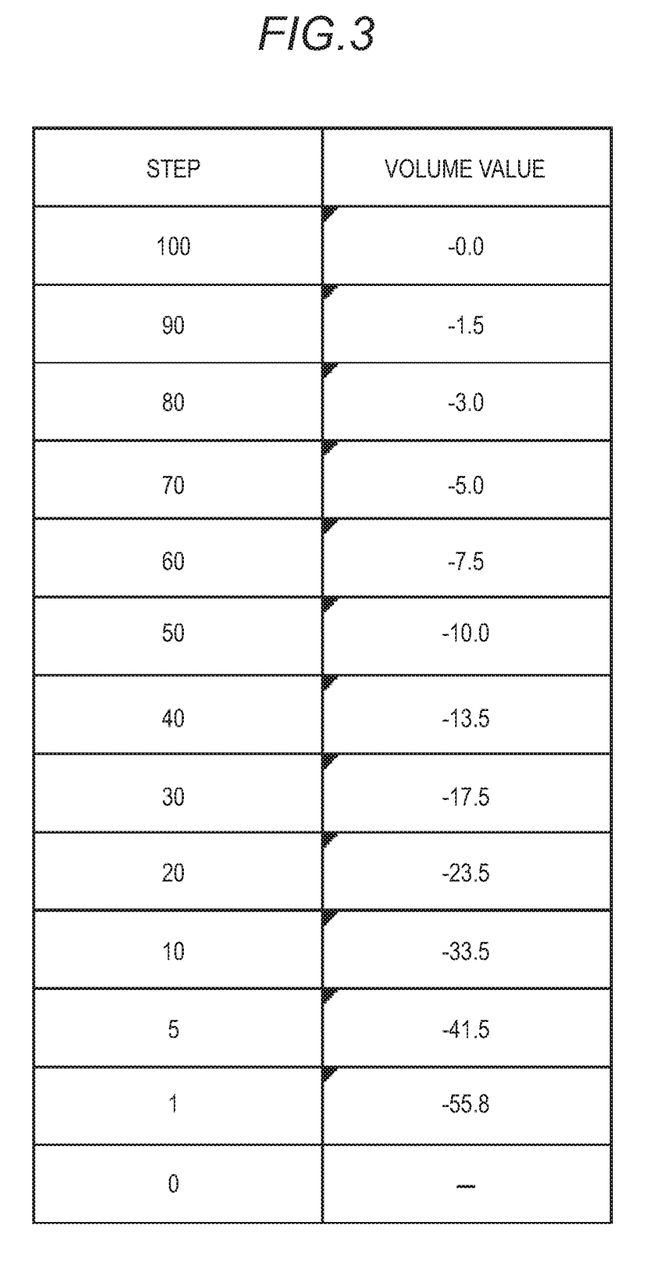
FIG. 3 shows an example volume value table of a personal computer (host).

The personal computer 2 has a volume value table 201 shown in FIG. 3 which is different from the volume value table 110 of the audio device 1 shown in FIG. 1. When information to the effect that the "+" button 140 or the "−" button 141 has been pushed is sent from the audio device 1, the personal computer 2 refers to this table, reads out a volume value of a step that is one step above or below a current step, and sends it to the audio device 1. FIG. 3 outlines the volume value table 201 at intervals of 10 steps and does not show the whole of the table.

Figure 4:
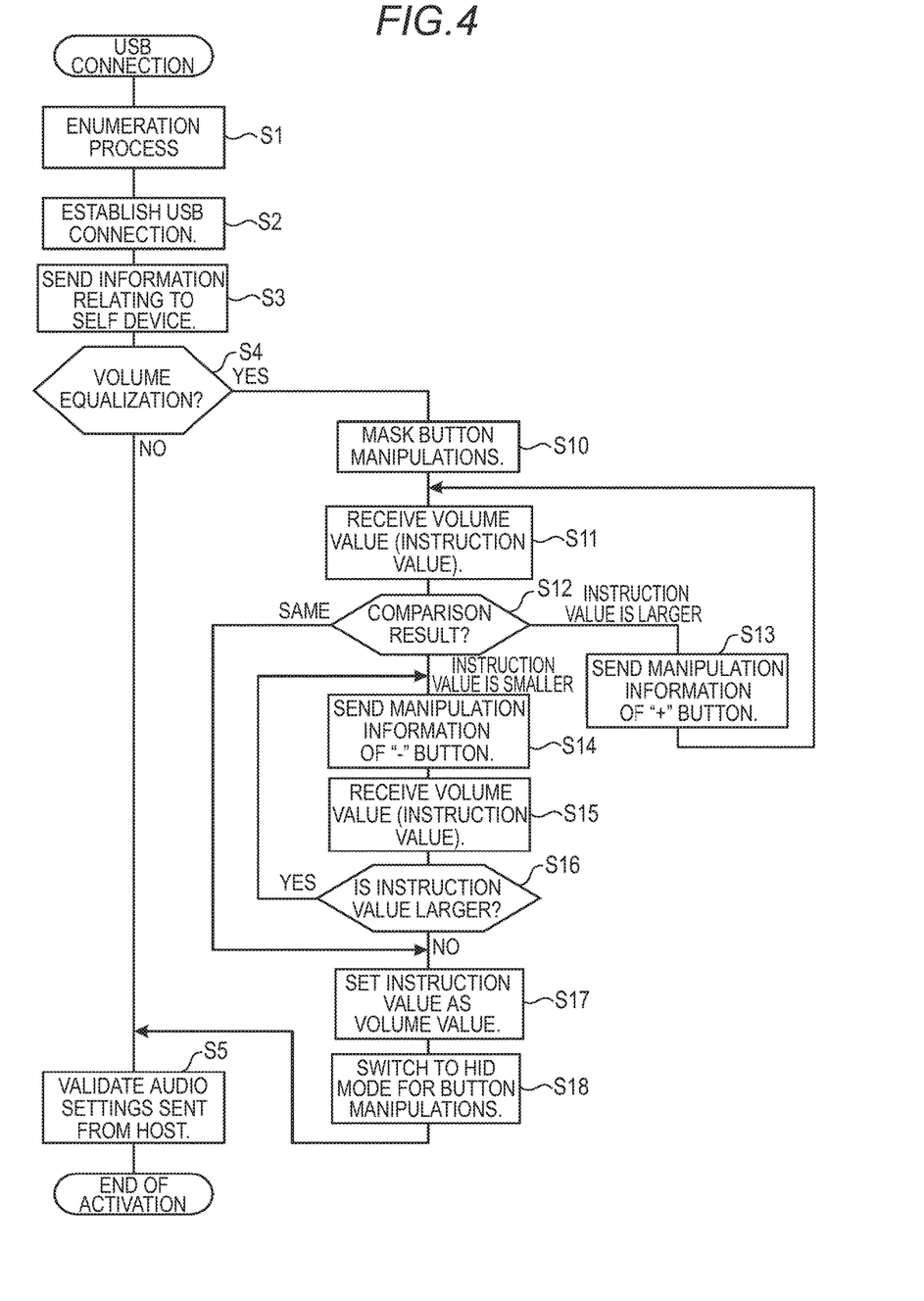
FIG. 4 is a flowchart illustrating how a control unit of the audio device operates at the time of connection to the host.
Figure 5A:
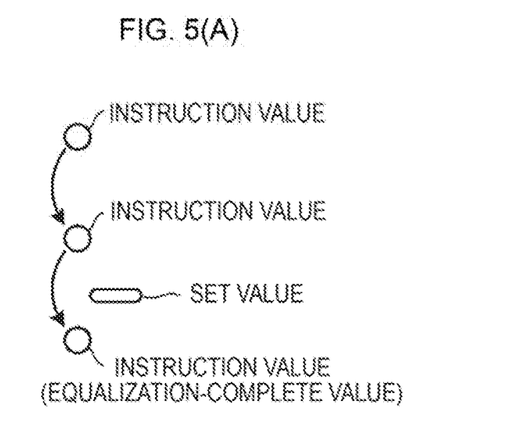
Figure 5B:
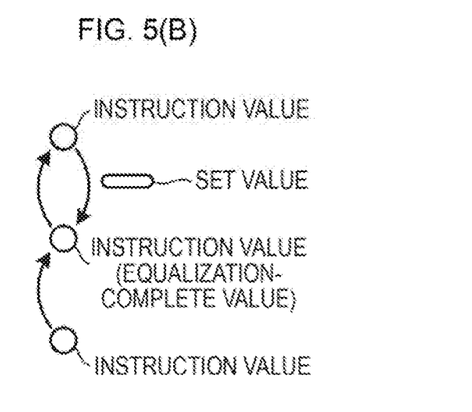

Now, a description will be made of the above-mentioned equalization process which is executed when the audio device 1 and the personal computer 2 are USB-connected to each other by referring to a flowchart of FIG. 4 and FIGS. 5(A) and 5(B) which illustrate transitions of the instruction value that is sent from the personal computer 2. When the audio device 1 and the personal computer 2 are connected to each other by the USB cable 3, first, an enumeration process is executed (S1) and a USB connection is established (S2). In the enumeration process, the personal computer 2 (host) recognizes the audio device 1 (device) and performs processing of selecting a driver that is suitable for the device and other processing. Upon recognizing the establishment of the USB connection, at step S3 the control unit 11 sends information relating to the self device to the personal computer 2 (host). (The personal computer 2 will be referred to as a host 2 in the following descriptions of flowcharts). The information relating to the self device is such information as a maximum value, a minimum value, and a control step of volume control and a current volume value. Although the host 2 receives these pieces of information, whether to control the audio device 1 on the basis of these pieces of information depends on an application.

Then the control unit 11 judges whether or not the current setting is such that the volume value of the self device should be equalized to that set in the host 2 (S4). This setting may be either one that is made from the host 2 or one that is made by a user with respect to the audio device 1. If the current setting is not such that the volume value of the self device should be equalized to that of the host 2 (S4: no), the control unit 11 validates audio settings other than the one relating to the volume value, such as a data transfer mode, without receiving a volume value from the host 2 (S5) and finishes the activation process.

If the current setting is such that the volume value of the self device should be equalized to that of the host 2 (S4: yes), the following equalization process is executed. First, manipulations on the buttons of the manipulation unit 14 are masked (S10). This is to prevent acceptance of an irrelevant manipulation of a user during the equalization process. In this state, the audio device 1 receives a volume value that the host 2 intends to set in the audio device 1 (S11). The audio device 1 disregards this instruction value temporarily (i.e., abstains from setting the received volume value (instruction value) in the volume control circuit 120), and compares the received volume value (instruction value) with a volume value (set value) that is currently set in the volume control circuit 120 (S12). If coincidence is found between the two volume values by the comparison, the equalization process is finished and this process moves to step S17. At step S17, the instruction value is set in the volume control circuit 120 and written to the volume value register 111. At step S18, switching to an HID mode is made for manipulations on the buttons of the manipulation unit 14. The HID mode is a mode in which the control unit 11 makes no judgment for changing of volume setting and manipulation information relating to volume setting is sent to the host 2 as an HID report. After the execution of steps S17 and S18, the process moves to step S5. At step S5 and the following steps, audio settings sent from the host 2 are made valid. That is, the audio device 1 stops disregarding the volume value instruction from the host 2 temporarily and comes to obey instructions from the host 2.

If it is judged at step S12 that the instruction value is larger than the set value, the audio device 1 sends manipulation information of the "−" button 141 to the host 2 to have the instruction value decreased (S14). That is, the audio device 1 sends manipulation information that would be generated if the "−" button 141 were manipulated. In response, the host 2 sends the volume value of the step that is one step below the current step by referring to the volume value table shown in FIG. 3. At step S15, the audio device 1 receives this new volume value (instruction value). The control unit 11 compares the new instruction value with the set value (S16). If the instruction value is still larger than the set value, the process returns to step S14 to decrease the instruction value again by a value corresponding to one step. If it is judged at step S16 that the instruction value is smaller than or equal to the set value (S16: no), the equalization process is finished and the process moves to step S17. FIG. 5(A) illustrates how the instruction value makes transitions as step S14 is executed twice to complete equalization. That is, the equalization process completes when the instruction value which was first larger than a set value has become smaller than or equal to it. With this measure, even if the volume value table (see FIG. 3) of the host 2 is different from the volume value table (see FIG. 2) of the self device, a step having a volume value (instruction value) that is closest to the set value that is the volume value of a step of the volume value table of the self device can be selected. Even if this volume value is set in the volume control circuit 120, a resulting sound volume difference would be so small as not to be realized by a user.

If it is judged at step S12 that the instruction value is smaller than the set value, the audio device 1 sends manipulation information of the "+" button 140 to the host 2 to have the instruction value increased (S13). That is, the audio device 1 sends manipulation information that would be generated if the "+" button 140 were manipulated. In response, the host 2 sends the volume value of the step that is one step above the current step by referring to the volume value table shown in FIG. 3. At step S11, the audio device 1 receives this new volume value (instruction value). The reason why the process returns to step S11 is to avoid finishing the equalization process in a state that a received instruction value is larger than the set value. If the received instruction value is larger than the set value, step S14 is executed to send manipulation information of the "−" button 141 to make the instruction value smaller than or equal to the set value. FIG. 5(B) illustrates how the instruction value makes transitions as step S13 is executed twice and then step S14 is executed once. With this measure, a value, closest to and slightly smaller than the set value, of a step of the table (see FIG. 3) of the host 2 is selected as an equalization-complete value.

With the above process, even if an instruction value that is sent from the host 2 for the first time is much different from a set value, volume adjustment manipulation information is sent to the host 2 until an instruction value that is close to the set value is obtained. This prevents an event that the first instruction value itself is regarded as a valid one and a loud sound is emitted suddenly.

Step S17 for replacing the set value with the instruction value may be omitted.

In the above process, if an instruction value is smaller than a set value (S12: instruction value is smaller), the instruction value is increased by a value corresponding to one step each time. Once the instruction value becomes larger than the set value (S12: instruction value is larger), the equalization process is finished after the instruction value is made smaller than the set value at steps S14-S16. Alternatively, the equalization process may be finished immediately when the instruction has just become larger than the set value (i.e., without executing steps S14-S16).

Each of steps S11 and S15 for receiving an instruction value may be finished upon time-out, that is, upon a lapse of a prescribed time (e.g., 50 ms). If a time-out occurs, an appropriate measure to take is to cancel the equalization process and move to step S5.

Upon execution of step S18, acceptance of manipulations on the "+" button 140, the "−" button 141, and the mute button 142 which are HID device manipulators is permitted. When one of these buttons is manipulated, resulting manipulation information is sent to the host 2. If the connection between the audio device 1 and the host (personal computer) 2 is canceled thereafter, a stand-alone mode is restored for the buttons ("+" button 140, "−" button 141, and mute button 142) of the manipulation unit 14 and the control unit 11 starts performing a volume value control that responds to manipulations on these buttons.

Figures 6A, 6B:
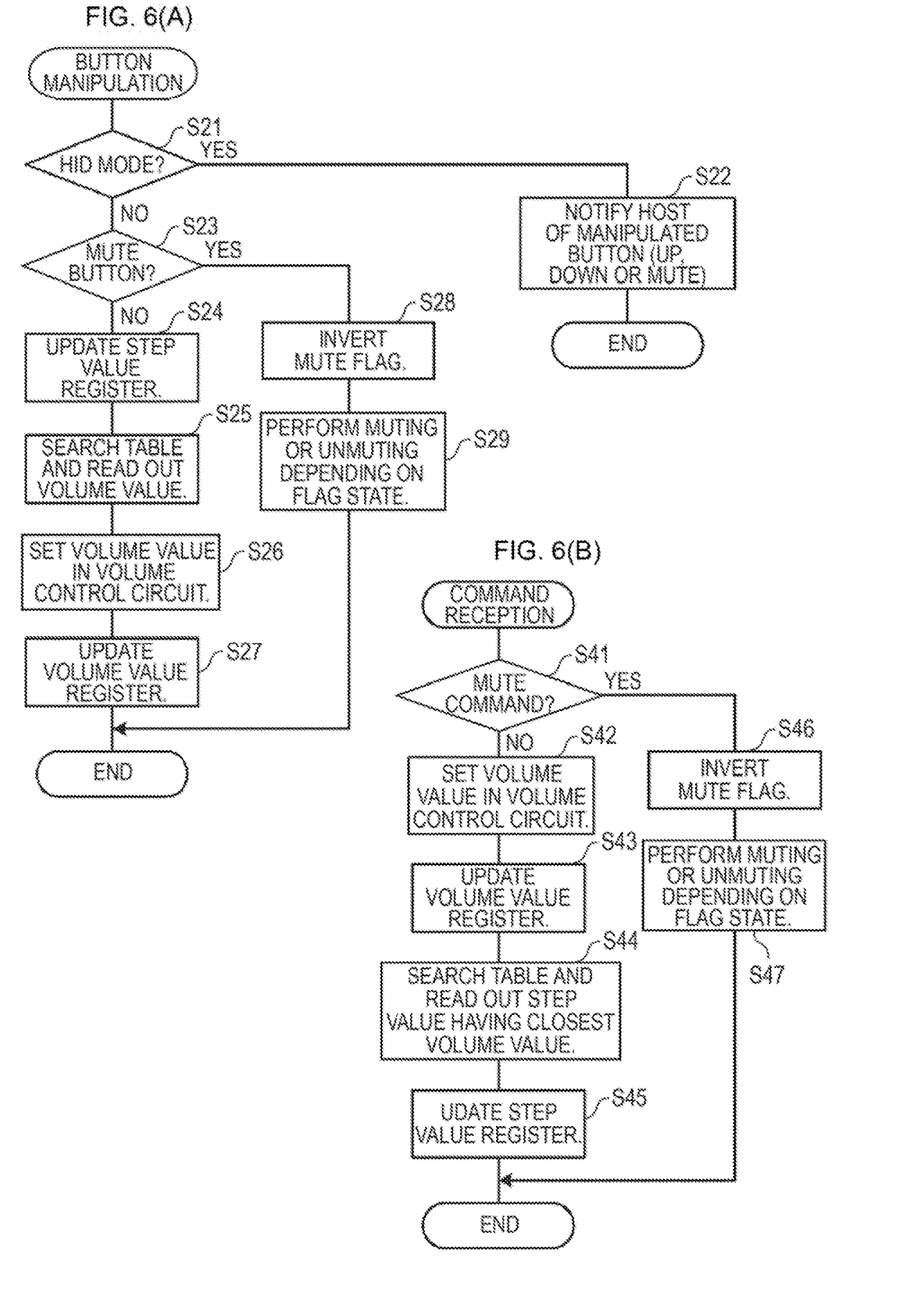

Now, referring to parts (A) and (B) of FIG. 6, a description will be made of processes that are executed by the control unit 11 when one of the buttons of the manipulation unit 14 is manipulated. Part (A) of FIG. 6 illustrates a process that is executed when a button of the manipulation unit 14 is manipulated. First, it is judged whether the current mode is the HID mode or the stand-alone mode (S21).

If the current mode is the stand-alone mode (S21: no), then it is judged whether the button pushed is the mute button 142 or not (S23). If the button pushed is the mute button 142 (S23: yes), the mute flag 113 is inverted and muting/unmuting of the audio circuit 12 is controlled according to the resulting state (set/reset) of the mute flag 113 (S29).

If the button pushed is the "+" button 140 or the "−" button 141, the value of the step value register 112 is updated, that is, incremented or decremented by "1" (S24) depending on whether the "+" button 140 or the "−" button 141 was pushed. At step S25, the volume value table 110 is searched using the updated step value and a corresponding volume value is read out. At step S26, this volume value is set in the volume control circuit 120 and a sound volume control is performed. At step S27, this volume value is written to the volume value register 111 (volume value update).

If it is judged at step S21 that the current mode is the HID mode (S21: yes), manipulation information corresponding to the manipulated button ("+" button 140, "−" button 141, or mute button 142) is sent to the host 2 as an HID class report (S22). Receiving this manipulation information, the host 2 determines a volume value (instruction value) on the basis of the volume value table shown in FIG. 3 and other things and returns a resulting command to the audio device 1.

Part (B) of FIG. 6 is a flowchart illustrating how the audio device 1 operates when a command is received from the host 2. First, it is judged whether the received command is a mute command or not (S41). If the received command is a mute command (S41: yes), the mute flag 113 is inverted (S46) and muting/unmuting of the audio circuit 12 is controlled according to the resulting state (set/reset) of the mute flag 113 (S47).

If the received command is a command indicating a volume value (instruction value) (S41: no), this volume value is set in the volume control circuit 120 and a sound volume control is performed (S42). At step S43, this volume value is written to the volume value register (volume value update). So that a smooth sound volume control will be performed in response to a button manipulation when the mode is switched to the stand-alone mode, the volume value table 110 (see FIG. 2) is searched for a step having a volume value that is closest to the volume value just set by the host 2 (S44) and the thus-found step value is written to the step value register 112 (S45).

As a result, when the USB connection to the host (personal computer) 2 is canceled and hence the mode is switched to the stand-along mode, in response to a manipulation on the "+" button 140 or the "−" button 141, a transition is made to the step that is one step above or below the step corresponding to the step value that is stored in the step value register 112. Thus, a smooth sound volume adjustment is enabled though the volume value table to be referred to is switched from the table 201 of the host 2 to the table 110 of the self device.

Parts (A) and (B) of FIG. 6 illustrate example processes in which after the button manipulation mode is switched to the HID mode a volume value control is performed according to the volume value table (see FIG. 3) of the host 2. However, it is possible to perform a control substantially according to the volume value table 110 of the self device even after the button manipulation mode is switched to the HID mode. It is also possible to allow a user to set which of the mode in which a volume value control is performed according to the volume value table of the host 2 or a mode in which a volume value control is performed substantially according to the volume value table 110 of the self device should be employed. In this case, this setting may be made either from the host 2 or by a user with respect to the audio device 1.

Figure 7:
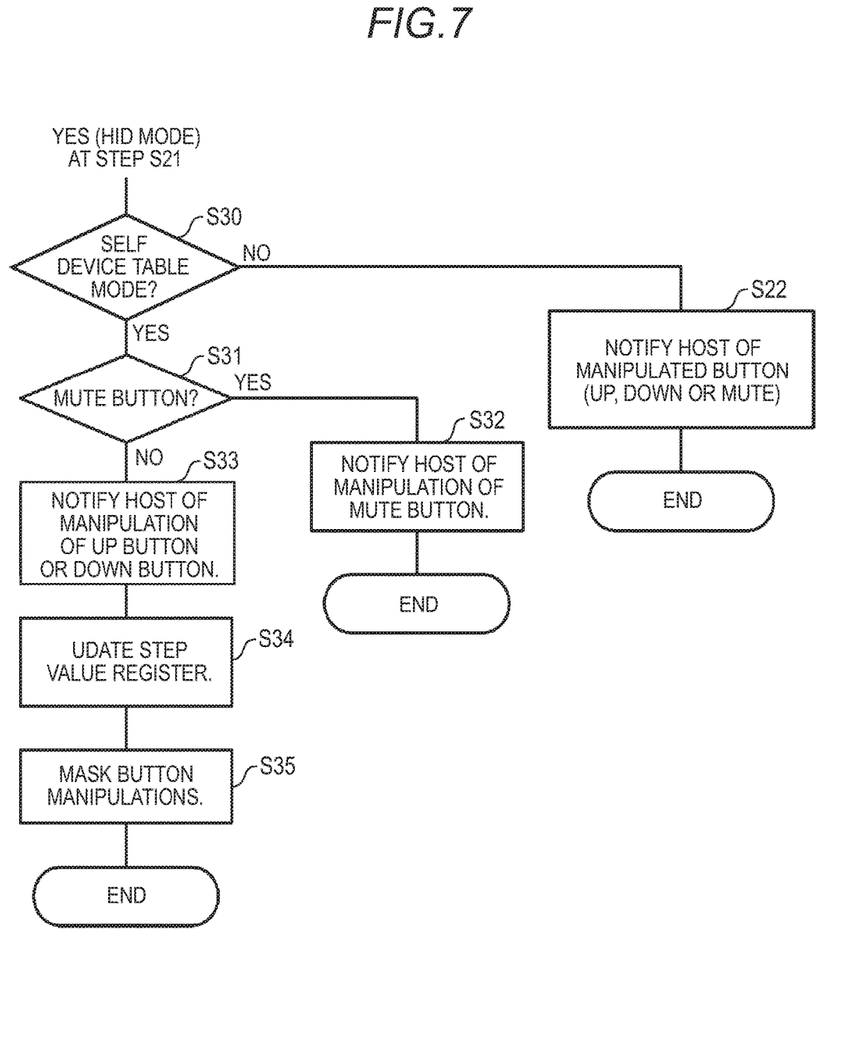
FIG. 7 is a flowchart illustrating how the control unit of the audio device operates in a state that the host is connected.
Figure 8:
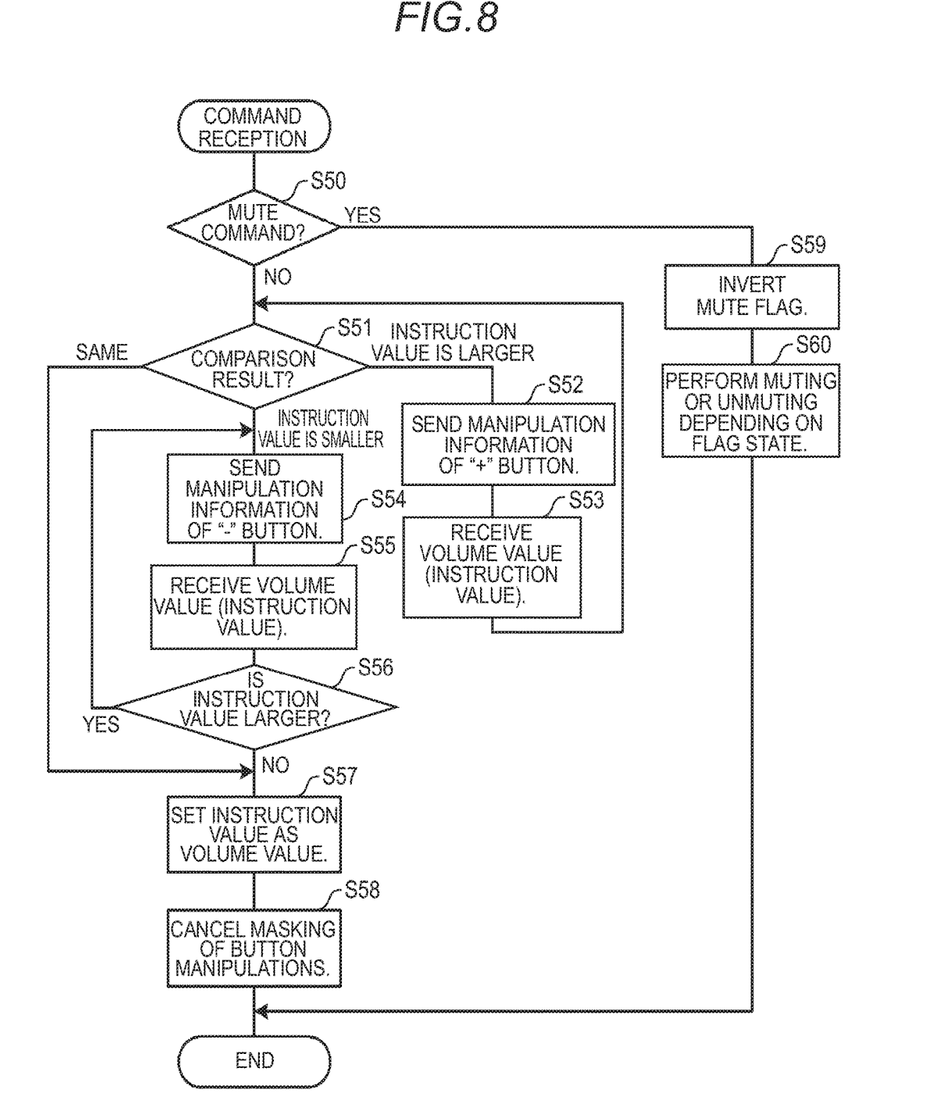
FIG. 8 is another flowchart illustrating how the control unit of the audio device operates in a state that the host is connected.

FIGS. 7 and 8 are flowcharts illustrating how the audio device 1 operates in the case where setting can be made to one of the mode (host table mode) in which a volume value control is performed according to the volume value table of the host 2 and the mode (self device table mode) in which a volume value control is performed substantially according to the volume value table 110 of the self device.

FIG. 7 is a flowchart illustrating only changes to the process shown in part (A) of FIG. 6 which is executed in response to a button manipulation. The process of FIG. 7 is executed when a button manipulation is made on the manipulation unit 14 in the process of part (A) of FIG. 6 and the mode of the manipulation unit 14 is judged to be the HID mode. First, it is judged whether the volume value control mode is the self device table mode or the host table mode (S30). If the volume value control mode is the host table mode (S30: no), as in the process of part (A) of FIG. 6, manipulation information corresponding to the manipulated button ("+" button 140, "−" button 141, or mute button 142) is sent to the host 2 as an HID class report (S22) and the process is finished.

If the volume value control mode is the self device table mode (S30: yes), then it is judged whether the button pushed is the mute button 142 or not (S31). If the button pushed is the mute button 142 (S31: yes), manipulation information corresponding to the mute button 142 is sent to the host 2 as an HID class report (S32) and the process is finished.

If the button pushed is not the mute button 142 (S31: no), manipulation information corresponding to the manipulated button ("+" button 140 or "−" button 141) is sent to the host 2 as an HID class report (S33) and the step value register 112 for storing a step value to be used in searching the volume value table 110 of the self device is updated. More specifically, the step value register 112 is updated to the step value that is one step above the currently registered step value in the volume value table 110 if the button pushed is the "+" button 140 and the step value register 112 is updated to the step value that is one step below the currently registered step value if the button pushed in the "−" button 141. At the same time, button manipulations are masked until completion of the volume value control (S35).

FIG. 8 is a flowchart illustrating how the audio device 1 operates when a volume control command is received from the host 2. First, it is judged whether the received command is a mute command or not (S50). If the received command is a mute command (S50: yes), the mute flag 113 is inverted (S59) and muting/unmuting of the audio circuit 12 is controlled according to the resulting state (set/reset) of the mute flag 113 (S60).

If the received command is a command indicating a volume value (instruction value) (S50: no), at step S51 the received volume value (instruction value) is compared with the volume value (target value) in the volume value table 110 corresponding to the step value that was written to the step value register 112 at step S34.

If it is found by the comparison that they coincide with each other, the equalization process is finished and the process moves to step S57. At step S57, the instruction value is set in the volume control circuit 120 and written to the volume value register 111. The masking of button manipulations that was done at step S35 is canceled (S58) and the process is finished.

If it is judged at step S51 that the instruction value is larger than the target value, manipulation information of the "−" button 141 is sent to the host 2 to have the instruction value decreased (S54). That is, manipulation information that would be generated if the "−" button 141 were manipulated is sent. In response, the host 2 sends the volume value of the step that is one step below the current step by referring to the volume value table shown in FIG. 3. At step S55, the audio device 1 receives this new volume value (instruction value). The new instruction value is compared with the target value (S56). If the instruction value is still larger than the target value, the process returns to step S54 to decrease the instruction value again by a value corresponding to one step. If it is judged at step S56 that the instruction value is smaller than or equal to the target value (S56: no), the equalization process is finished and the process moves to step S57.

If it is judged at step S51 that the instruction value is smaller than the target value, manipulation information of the "+" button 140 is sent to the host 2 to have the instruction value increased (S52). That is, manipulation information that would be generated if the "+" button 140 were manipulated is sent. In response, the host 2 sends the volume value of the step that is one step above the current step by referring to the volume value table shown in FIG. 3. At step S53, the control unit 11 receives this new volume value (instruction value). And the process returns to step S51. The reason why the process is returned to step S51 is to avoid finishing the equalization process in a state that a received instruction value is larger than the target value. If the received instruction value is larger than the set value, step S54 is executed to send manipulation information of the "−" button 141 to make the instruction value smaller than or equal to the set value. With the above process, even in the HID mode in which a volume value control is performed using the volume value table of the host 2, the sound volume can be controlled with volume value intervals that are substantially the same as ones corresponding to the steps of the volume value table 110 of the self device.

Figure 9:
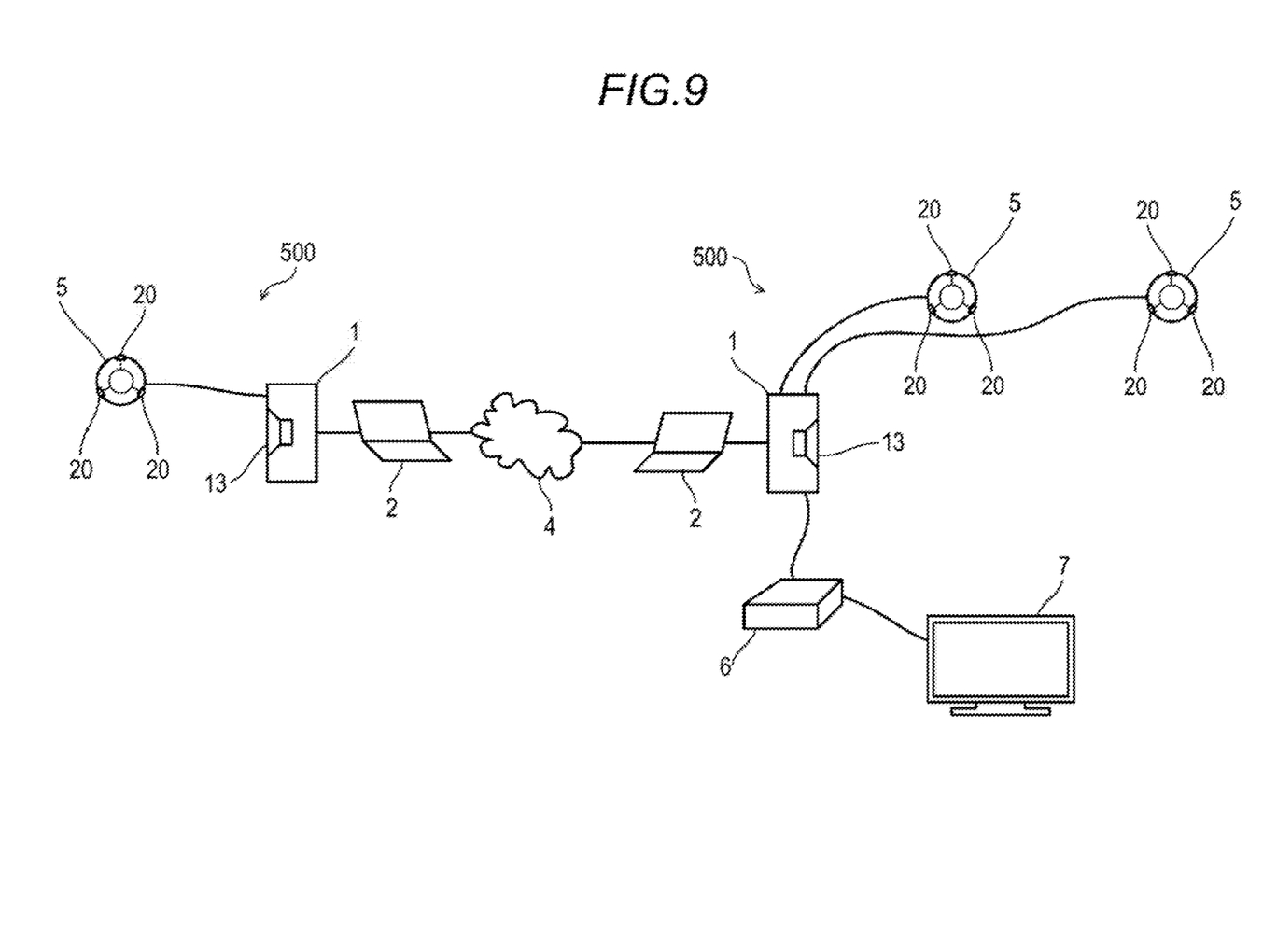
FIG. 9 shows the configuration of an audio conference system to which the invention is applied.

The invention can be applied to any audio devices as long as they are equipped with an audio reproduction function; the invention can be applied to an audio conference system 500 shown in FIG. 9. The audio conference system 500 is composed of a parent device 1 which is an audio device and child devices 5 each having microphones 20, and is a system in which the parent device 1 communicates with another audio conference system 500 installed at another location and having a similar configuration over a network 4 according to an audio conference program of a personal computer 2 (host). It is possible to connect a video conference device 6 to the parent device 1 via an analog audio cable. A TV receiver 7 is connected to the video conference device 6.

Although the embodiment is directed to the volume value equalization process for adjusting the reproduction sound volume, the invention can also be applied to an equalization process for the microphone gain of sound pickup by a microphone.

The audio device, audio system, and volume value control method according to the embodiment will be summarized below:

(1) An audio device comprising:
an amplifier having a volume control unit;
a communication unit configured to communicate with a host apparatus; and
a control unit configured to set a volume value in the volume control unit,
wherein the control unit receives, from the host apparatus through the communication unit, an instruction value indicating a volume value to be set in the volume control unit, compares the received instruction value with a set value that is a volume value set in the volume control unit, and sends an instruction signal based on a comparison result to the host apparatus through the communication unit.

(2) The audio device according to item (1), wherein if the comparison result is that the instruction value is larger than the set value, the instruction signal is a signal that requests the host apparatus to cause volume value decrease; and
wherein the control unit executes a first volume value equalization process in which the instruction signal is sent to the host apparatus through the communication unit and an instruction value that has been produced by update according to the instruction signal is received from the host apparatus through the communication unit.

(3) The audio device according to item (2), wherein the first volume value equalization process includes an instruction value decreasing process in which a process of sending, to the host apparatus, a signal that requests the host apparatus to decrease the instruction value by one step and receiving, from the host apparatus, an instruction value that has been produced by update according to the signal is repeated.

(4) The audio device according to item (3), wherein the first volume value equalization process finishes the instruction value decreasing process when the updated instruction value is smaller than or equal to the set value.

(5) The audio device according to item (1), wherein if the comparison result is that the instruction value is smaller than the set value, the instruction signal is a signal that requests the host apparatus to cause volume value increase; and wherein the control unit executes a second volume value equalization process in which the instruction signal is sent to the host apparatus through the communication unit and an instruction value that has been produced by update according to the instruction signal is received from the host apparatus through the communication unit.

(6) The audio device according to item (5), wherein the second volume value equalization process includes an instruction value increasing process in which a process of sending, to the host apparatus, a signal that requests the host apparatus to increase the instruction value by one step and receiving, from the host apparatus, an instruction value that has been produced by update according to the signal is repeated.

(7) The audio device according to item (6), wherein the second volume value equalization process finishes the instruction value increasing process when the updated instruction value is larger than or equal to the set value.

(8) The audio device according to item (7), wherein in the second volume value equalization process, when the updated instruction value is larger than the set value, a process of sending, to the host apparatus, a signal that requests the host apparatus to decrease the instruction value by one step and receiving, from the host apparatus, an instruction value that has been produced by update according to the signal is repeated is executed once.

(9) The audio device according to any one of items (1) to (8), further comprising a manipulation unit including a first button and a second button, wherein the control unit sends, to the host apparatus, a signal that requests one-step increase of the instruction value when the first button is manipulated, and sends, to the host apparatus, a signal that requests one-step decrease of the instruction value when the second button is manipulated.

(10) The audio device according to item (9), wherein in a state that the host apparatus is not connected, the control unit increases the set value by one step when the first button is manipulated and decreases the set value by one step when the second button is manipulated.

(11) The audio device according to any one of items (1) to (10), further comprising:

a manipulation unit configured to receive a manipulation for the volume value; and a volume value table which is stored with volume value target values corresponding to manipulations on the manipulation unit, wherein the control unit:

reads out, in response to a manipulation on the manipulation unit, a target value corresponding to the manipulation on the manipulation unit from the volume value table, and sends manipulation information relating to the manipulation on the manipulation unit to the host apparatus through the communication unit;

receives, through the communication unit, an instruction value that is sent from the host apparatus in response to the manipulation information and indicates a volume value to be set in the volume control unit;

compares the received instruction value with the target value;

if a comparison result is that the instruction value is larger than the target value, repeats a process of sending, to the host apparatus, an instruction signal that requests volume value decrease and receiving, from the host apparatus, an instruction value that has been produced by update according to the instruction signal; and if the received instruction signal is smaller than or equal to the target value, sets the instruction value in the volume control unit.

(12) An audio system comprising:

a host apparatus; and an audio device configured to communicate with the host apparatus through a communication unit, wherein the audio device comprises:

an amplifier including a volume control unit; and a control unit configured to set a volume value in the volume control unit; and wherein the control unit receives, from the host apparatus through the communication unit, an instruction value indicating a volume value to be set in the volume control unit, compares the received instruction value with a set value that is a volume value set in the volume control unit, and sends an instruction signal based on a comparison result to the host apparatus through the communication unit.

(13) The audio system according to item (12), wherein if the comparison result is that the instruction value is larger than the set value, the instruction signal is a signal that requests the host apparatus to cause volume value decrease; and wherein the control unit executes a volume value equalization process in which the instruction signal is sent to the host apparatus through the communication unit and an instruction value that has been produced by update according to the instruction signal is received from the host apparatus through the communication unit.

(14) A volume value control method of an audio device capable of communicating with a host apparatus, the volume value control method comprising:

receiving, from the host apparatus, an instruction value indicating a volume value to be set in a volume control unit of the audio device;

comparing the received instruction value with a set value that is a volume value set in the volume control unit; and sending an instruction signal based on a result of the comparison to the host apparatus.

(15) The volume value control method according to item (14), wherein if the result of the comparison is that the instruction value is larger than the set value, the instruction signal is a signal that requests the host apparatus to cause volume value decrease; and wherein an instruction value that has been produced by update according to the instruction signal sent to the host apparatus is received from the host apparatus.

In the audio device according to the invention, when it is connected to the host apparatus, a volume (sound volume) adjustment is performed in which a volume instruction value specified by the host apparatus is set in the volume control unit. The audio device can also operate in a state that it is not connected to the host apparatus (stand-alone mode). If a large volume value is specified by the host apparatus when the audio device that has been used with a certain volume value in the stand-alone mode is connected to the host apparatus, there is risk that a loud sound is emitted from a speaker or an earphone. In view of the above, in the invention, in this situation, a signal that requests volume value decrease is sent to make the instruction value closer to the current set value.

According to the audio devices recited items (3) and (4), since a signal for decreasing the instruction value by one step is sent repeatedly, a proper instruction value can be found by bringing the instruction value closer to the set value gradually. By finishing this process when the instruction value has become smaller than or equal to the set value, a value that is closest to and smaller than or equal to the set value can be obtained as a final instruction value.

In the audio devices recited in items (5), (6), and (7), the second volume value equalization process may include the instruction value increasing process in which the process of outputting, to the host apparatus, a signal that requests one-step increase of the instruction value and receiving a new instruction value from the host apparatus is repeated. The second volume value equalization process may finish the instruction value increasing process when the instruction value has become larger than or equal to the set value.

According to the audio device recited in item (8), since the second volume value equalization process is executed, even in the case where the instruction value is smaller than the set value, the instruction value can be brought closer to the set value in the same manner as in the case where the instruction value is larger than the set value.

According to the audio device recited in item (9), in a state that the host apparatus is not connected, the control unit may increase the set value by one step when the first button is manipulated and decrease the set value by one step when the second button is manipulated.

According to the audio device recited in item (11), the audio system according to the invention comprises a host apparatus and an audio device which communicates with the host apparatus through a communication unit. The audio device comprises an amplifier including a volume control unit and a control unit which sets a volume value in the volume control unit. The control unit receives, from the host apparatus, an instruction value indicating a volume value to be set in the volume control unit, disregards this instruction temporarily, compares the received instruction value with a set value that is a volume value set in the volume control unit, and, if a comparison result is that the instruction value is larger than the set value, executes volume value equalization process of sending the host apparatus a signal that requests volume value decrease and receiving a new instruction value from the host apparatus.

The present application is based on Japanese Patent Application No. 2014-083208 filed on Apr. 14, 2014 and No. 2014-225868 filed on Nov. 6, 2014, the disclosures of which are incorporated herein by reference.

INDUSTRIAL APPLICABILITY

The audio device, audio system, and volume value control method according to the invention are useful in being capable of providing audio devices and audio systems that do not emit a loud sound suddenly at the time of connection because they perform volume value equalization, even if a volume value stored in a host is entirely different from a volume value that is currently set in an audio device.

DESCRIPTION OF SYMBOLS

1 . . . Audio device; 2 . . . Personal computer (host); 3 . . . USB cable; 12 . . . Audio circuit; 120 . . . Volume control circuit; 500 . . . Audio conference system.

The invention claimed is:

1. An audio device comprising:
an amplifier having a volume control circuit;
a communication circuit configured to communicate with a host apparatus;
a memory storing instructions;
a processor configured to implement the instructions stored in the memory and execute:
  a volume setting task that sets a volume value in the volume control circuit;
  a receiving task that receives, from the host apparatus through the communication circuit, an instruction value indicating a volume value to be set in the volume control circuit;
  a comparing task that compares the received instruction value with the volume value set by the volume setting task; and
  a sending task that sends an instruction signal based on a result of the comparison of the received instruction value with the set volume value made by the comparing task to the host apparatus through the communication circuit,
wherein the processor repeats the receiving task, the comparing task, and the sending tasks until the received instruction value compared by the comparing task corresponds to the volume value set by the volume setting task.

2. The audio device according to claim 1, wherein, when the comparison result is that the received instruction value is larger than the set volume value:
  the sending task sends, to the host apparatus, an instruction signal that requests the host apparatus to execute a volume value equalization control that decreases the volume value to be set in the volume control circuit, and
  the receiving task receives, from the host apparatus, an updated instruction value that has been updated by the host apparatus according to the sent instruction signal.

3. The audio device according to claim 2, wherein the volume value equalization control decreases the instruction value by one step to receive, from the host apparatus, the updated instruction value.

4. The audio device according to claim 1, wherein, when the comparison result is that the instruction value is smaller than the set volume value:
  the sending task sends, to the host apparatus, an instruction signal that requests the host apparatus to execute a volume value equalization control that increases the volume value to be set in the volume control circuit, and
  the receiving task receives, from the host, an updated instruction value that has been updated by the host apparatus according to the sent instruction signal.

5. The audio device according to claim 4, wherein the volume value equalization control increases the instruction value by one step to receive, from the host apparatus, the updated instruction value.

6. The audio device according to claim 5, wherein the volume value equalization control ends when the updated instruction value is equal to the set volume value.

7. The audio device according to claim 6, wherein when the comparison result is that the updated instruction value is larger than the set volume value:
  the sending task sends, to the host apparatus, an instruction signal that requests the host apparatus to decrease the instruction value by one step; and
  the receiving task receives, from the host apparatus, another updated instruction value that has been updated by the host apparatus according to the sent instruction signal.

8. The audio device according to claim 1, further comprising:
  a manipulation circuit including a first button and a second button, wherein the sending task sends, to the host apparatus, an instruction signal that requests:
one-step increase of the instruction value when the first button is manipulated; and
one-step decrease of the instruction value when the second button is manipulated.

9. The audio device according to claim 8, wherein when the host apparatus is not connected:
the first button increases the set volume value by one step when manipulated; and
the second button decreases the set volume value by one step when manipulated.

10. The audio device according to claim 1, further comprising:
a manipulation circuit configured to receive a manipulation instruction for the volume value,
wherein a volume value table is stored with volume value target values corresponding to received manipulation instructions on the manipulation circuit,
wherein the processor is configured to further execute a reading task that reads, in response to receiving a manipulation instruction on the manipulation circuit, a target value corresponding to the manipulation instruction on the manipulation circuit from the volume value table,
wherein the sending task sends manipulation information relating to the manipulation on the manipulation circuit to the host apparatus through the communication circuit,
wherein the receiving task receives, through the communication circuit, an instruction value from the host apparatus in response to the manipulation information and indicates a volume value to be set in the volume control circuit,
wherein the comparing task compares the received instruction value with the target value,
wherein when a comparison result is that the received instruction value is larger than the target value, the processor repeats the sending task that sends, to the host apparatus, an instruction signal that requests decrease in the volume value and the receiving task that receives, from the host apparatus, an updated instruction value that has been updated by the host apparatus according to the sent instruction signal, and
wherein when the received updated instruction value is smaller than or equal to the target value, the volume setting task sets the updated instruction value in the volume control circuit.

11. An audio device comprising:
an amplifier having a volume control circuit;
a communication circuit configured to communicate with a host apparatus;
a memory storing instructions;
a processor configured to implement the instructions stored in the memory and execute:
a volume setting task that sets a volume value in the volume control circuit;
a receiving task that receives, from the host apparatus through the communication circuit, an instruction value indicating a volume value to be set in the volume control circuit;
a comparing task that compares the received instruction value with the volume value set by the volume setting task;
a sending task that sends an instruction signal based on a result of the comparison of the received instruction value with the set volume value made by the comparing task to the host apparatus through the communication circuit,
wherein, when the comparison result is that the received instruction value is larger than the set volume value:
the sending task sends, to the host apparatus, an instruction signal that requests the host apparatus to execute a volume value equalization control that decreases the volume value to be set in the volume control circuit; and
the receiving task receives, from the host apparatus, an updated instruction value that has been updated by the host apparatus according to the sent instruction signal,
wherein the volume value equalization control decreases the instruction value by one step repeatedly to repeatedly receive, from the host apparatus, an updated instruction value that has been updated by the host apparatus according to the sent instruction signal, and
wherein the volume value equalization control ends when the updated instruction value is smaller than or equal to the set volume value.

12. An audio system comprising:
a host apparatus; and
an audio device configured to communicate with the host apparatus through a communication circuit, and comprising:
an amplifier including a volume control circuit; and
a control circuit configured to provide:
a setting control that sets a volume value in the volume control circuit;
a receiving control that receives, from the host apparatus through the communication circuit, an instruction value indicating a volume value to be set in the volume control circuit;
a comparing control that compares the received instruction value with the volume value set in the volume control circuit; and
a sending control that sends an instruction signal based on the comparison of the received instruction value with the set volume value made by the comparing control to the host apparatus through the communication circuit,
wherein the control circuit repeats the receiving control, the comparing control, and the sending control until the received instruction value compared by the comparing control corresponds to the volume value set by the setting control.

13. The audio system according to claim 12, wherein when the comparison result is that the received instruction value is larger than the set volume value:
the receiving control sends, to the host apparatus, an instruction signal that requests the host apparatus to decrease volume value, and
the receiving control receives an updated instruction value that has been updated by the host apparatus according to the sent instruction signal.

14. A volume value control method comprising the steps of:
receiving, from a host apparatus, an instruction value indicating a volume value to be set in a volume control circuit of an audio device;
comparing the received instruction value with a volume value set in the volume control circuit;

sending an instruction signal based on the comparison of the received instruction value with the set volume value made in the comparing step to the host apparatus; and repeating the receiving step, the comparing step, and the sending step until the received instruction value compared by the comparing step corresponds to the set volume value.

15. The volume value control method according to claim 14, wherein, when the result of the comparison is that the instruction value is larger than the set volume value:

the sending step sends, to the host apparatus, an instruction signal that requests the host apparatus to decrease the volume value, and the receiving step receives, from the host apparatus, an updated instruction value that has been updated by the host apparatus according to the sent instruction signal.

16. The volume value control method according to claim 15, wherein the instruction signal requests the host apparatus to execute an instruction value decreasing control that decreases the instruction value by one step so that the receiving step receives, from the host apparatus, the updated instruction value.

17. The volume value control method according to claim 14, wherein when the comparison result is that the instruction value is smaller than the set volume value:

the sending step sends, to the host apparatus, an instruction signal that requests the host apparatus to increase the volume value, and the receiving step receives, from the host apparatus, an updated instruction value that has been updated by the host apparatus according to the sent instruction signal.

18. The volume value control method according to claim 17, wherein the instruction signal requests the host apparatus to execute an instruction value increasing control that increases the instruction value by one step so that the receiving step receives, from the host apparatus, the updated instruction value.

19. The volume value control method according to claim 18, wherein the instruction value increasing control ends when the updated instruction value is equal to the set volume value.

20. The audio device according to claim 1, wherein:

the comparing task compares the received instruction value with the volume value set by the volume setting task without setting the received instruction value in the volume control circuit, when the comparison result is that the received instruction value is larger than the set volume value, the sending task sends, to the host apparatus, an instruction signal that requests the host apparatus to decrease the volume value to be set in the volume control circuit, and when the comparison result is that the instruction value is smaller than the set volume value, the sending task sends, to the host apparatus, an instruction signal that requests the host apparatus to increase the volume value to be set in the volume control circuit.

21. A volume value control method comprising the steps of:

receiving, from a host apparatus, an instruction value indicating a volume value to be set in a volume control circuit of an audio device;

comparing the received instruction value with a volume value set in the volume control circuit; and sending an instruction signal based on the comparison of the received instruction value with the set volume value made in the comparing step to the host apparatus, wherein, when the result of the comparison is that the instruction value is larger than the set volume value:

the sending step sends, to the host apparatus, an instruction signal that requests the host apparatus to decrease the volume value; and the receiving step receives, from the host apparatus, an updated instruction value that has been updated by the host apparatus according to the sent instruction signal, wherein the instruction signal requests the host apparatus to execute an instruction value decreasing control that decreases the instruction value by one step repeatedly so that the receiving step repeatedly receives, from the host apparatus, the updated instruction value, and wherein the instruction value decreasing control ends when the updated instruction value is smaller than or equal to the set volume value.

\* \* \* \* \*